United States Patent
Katsuno et al.

(10) Patent No.: US 9,299,889 B2
(45) Date of Patent: *Mar. 29, 2016

(54) SEMICONDUCTOR LIGHT EMITTING DEVICE

(71) Applicant: KABUSHIKI KAISHA TOSHIBA, Minato-ku (JP)

(72) Inventors: Hiroshi Katsuno, Tokyo (JP); Satoshi Mitsugi, Kanagawa-ken (JP); Toshiyuki Oka, Kanagawa-ken (JP); Shinya Nunoue, Chiba-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/203,217

(22) Filed: Mar. 10, 2014

(65) Prior Publication Data

US 2014/0191269 A1    Jul. 10, 2014

Related U.S. Application Data

(62) Division of application No. 13/222,302, filed on Aug. 31, 2011.

(30) Foreign Application Priority Data

May 16, 2011    (JP) .................................. 2011-109921

(51) Int. Cl.
*H01L 21/20* (2006.01)
*H01L 33/20* (2010.01)
(Continued)

(52) U.S. Cl.
CPC ................ *H01L 33/20* (2013.01); *H01L 33/32* (2013.01); *H01L 33/36* (2013.01); *H01L 33/387* (2013.01);
(Continued)

(58) Field of Classification Search
CPC ... H01L 2924/00; H01L 33/385; H01L 33/46; H01L 2924/12041; H01L 2924/3025; H01L 33/405

USPC ........................ 257/98, 99, 79, 76; 438/22, 34
See application file for complete search history.

(56) References Cited

U.S. PATENT DOCUMENTS 7,190,005 B2 *   3/2007   Gibb ....................... H01L 33/40
                                                                                257/103
7,732,231 B1     6/2010   Aldaz et al.
(Continued)

FOREIGN PATENT DOCUMENTS

EP    0 926 744 A2    6/1999
EP    0 926 744 A3    6/1999
(Continued)

OTHER PUBLICATIONS

Japanese Office Action issued Jul. 29, 2014, in Japan Patent Application No. 2012-099973 (with English translation).
(Continued)

*Primary Examiner* — Jaehwan Oh
(74) *Attorney, Agent, or Firm* — Oblon, McClelland, Maier & Neustadt, L.L.P.

(57) ABSTRACT

According to one embodiment, a semiconductor light emitting device includes a stacked structure body, a first electrode, a second electrode, and a dielectric body part. The stacked structure body includes a first semiconductor layer, having a first portion and a second portion juxtaposed with the first portion, a light emitting layer provided on the second portion, a second semiconductor layer provided on the light emitting layer. The first electrode includes a contact part provided on the first portion and contacting the first layer. The second electrode includes a first part provided on the second semiconductor layer and contacting the second layer, and a second part electrically connected with the first part and including a portion overlapping with the contact part when viewed from the first layer toward the second layer. The dielectric body part is provided between the contact part and the second part.

12 Claims, 11 Drawing Sheets

(51) Int. Cl.
*H01L 33/40* (2010.01)
*H01L 33/44* (2010.01)
*H01L 33/36* (2010.01)
*H01L 33/32* (2010.01)
*H01L 33/62* (2010.01)
*H01L 33/00* (2010.01)
*H01L 33/22* (2010.01)
*H01L 33/38* (2010.01)
*H01L 33/64* (2010.01)

(52) U.S. Cl.
CPC .............. *H01L 33/405* (2013.01); *H01L 33/44* (2013.01); *H01L 33/62* (2013.01); *H01L 33/0079* (2013.01); *H01L 33/22* (2013.01); *H01L 33/382* (2013.01); *H01L 33/647* (2013.01); *H01L 2224/48091* (2013.01); *H01L 2224/73265* (2013.01)

(56) References Cited

U.S. PATENT DOCUMENTS

| | | | | |
|---|---|---|---|---|
| 7,795,623 B2* | 9/2010 | Emerson | ........ | H01L 33/14 257/79 |
| 7,880,184 B2* | 2/2011 | Iwafuchi | ........ | H01L 21/2007 257/79 |
| 7,888,690 B2* | 2/2011 | Iwafuchi | ........ | H01L 21/2007 257/79 |
| 7,973,329 B2* | 7/2011 | Lee | ........ | H01L 33/385 257/81 |
| 8,163,577 B2* | 4/2012 | Emerson | ........ | H01L 33/14 257/79 |
| 8,183,072 B2* | 5/2012 | Seo | ........ | H01L 33/007 257/96 |
| 8,211,724 B2* | 7/2012 | Kim | ........ | H01L 27/153 257/96 |
| 8,232,571 B2* | 7/2012 | Seo | ........ | H01L 27/153 257/96 |
| 8,288,781 B2* | 10/2012 | Seo | ........ | H01L 27/156 257/88 |
| 8,421,085 B2* | 4/2013 | Katsuno | ........ | H01L 33/382 257/76 |
| 8,421,112 B2* | 4/2013 | Jeong | ........ | H01L 33/44 257/91 |
| 8,492,782 B2* | 7/2013 | Lee | ........ | H01L 33/385 257/79 |
| 8,759,863 B2* | 6/2014 | Sugizaki | ........ | H01L 33/0095 257/98 |
| 2004/0012958 A1* | 1/2004 | Hashimoto | ........ | H01L 33/38 362/241 |
| 2004/0232439 A1* | 11/2004 | Gibb | ........ | H01L 33/40 257/103 |
| 2005/0072980 A1* | 4/2005 | Ludowise | ........ | H01L 33/60 257/79 |
| 2006/0124954 A1 | 6/2006 | Akaishi | | |
| 2007/0181895 A1* | 8/2007 | Nagai | ........ | H01L 33/0079 257/98 |
| 2007/0190676 A1* | 8/2007 | Chu | ........ | H01L 33/22 438/22 |
| 2008/0217635 A1* | 9/2008 | Emerson | ........ | H01L 33/14 257/98 |
| 2009/0267106 A1* | 10/2009 | Lee | ........ | H01L 33/44 257/99 |
| 2010/0019387 A1* | 1/2010 | Miura | ........ | H01L 23/3114 257/773 |
| 2010/0078656 A1* | 4/2010 | Seo | ........ | H01L 27/156 257/88 |
| 2010/0220757 A1* | 9/2010 | Kitagawa | ........ | H01L 33/22 372/44.01 |
| 2010/0267181 A1* | 10/2010 | Niki | ........ | H01L 33/007 438/46 |
| 2010/0308437 A1* | 12/2010 | Okuno | ........ | C30B 25/18 257/615 |
| 2011/0008922 A1* | 1/2011 | Emerson | ........ | H01L 33/14 438/38 |
| 2011/0062488 A1 | 3/2011 | Uemura et al. | | |
| 2011/0117726 A1* | 5/2011 | Pinnington | ........ | H01L 21/02389 438/458 |
| 2011/0127539 A1* | 6/2011 | Komada | ........ | H01L 33/382 257/76 |
| 2011/0183472 A1* | 7/2011 | Lin | ........ | H01L 21/486 438/118 |
| 2011/0193113 A1* | 8/2011 | Jeong | ........ | H01L 33/44 257/91 |
| 2011/0193123 A1* | 8/2011 | Moon | ........ | H01L 33/382 257/98 |
| 2011/0212559 A1* | 9/2011 | Ohmae | ........ | C30B 23/04 438/46 |
| 2011/0284823 A1* | 11/2011 | Lee | ........ | H01L 33/44 257/13 |
| 2011/0284908 A1* | 11/2011 | Muramoto | ........ | H01L 33/38 257/98 |
| 2012/0305933 A1* | 12/2012 | Nakahata | ........ | H01L 33/16 257/76 |

FOREIGN PATENT DOCUMENTS

| | | |
|---|---|---|
| EP | 1 959 503 A1 | 8/2008 |
| JP | 10-163530 | 6/1998 |
| JP | 2001-203386 | 7/2001 |
| JP | 2009-218483 A | 9/2009 |
| JP | 2009-238879 | 10/2009 |
| JP | 2010-123717 A | 6/2010 |
| JP | 2010-192645 | 9/2010 |
| JP | 2010-192859 | 9/2010 |
| JP | 2010-283196 A | 12/2010 |
| JP | 2011-503898 | 1/2011 |
| JP | 2011-166150 | 8/2011 |
| JP | 2011-198997 A | 10/2011 |
| KR | 10-2009-0112308 A | 10/2009 |
| KR | 10-2010-0036617 | 4/2010 |
| KR | 10-0986560 | 10/2010 |
| WO | WO 02/089221 A1 | 11/2002 |

OTHER PUBLICATIONS

Ansgar Laubsch et al., "High-Power and High-Efficiency InGaN-Based Light Emitters", IEEE Transactions on Electron Devices, vol. 57, No. 1, Jan. 2010, pp. 79-87.
T. Fujii et al., "Increase in the Extraction Efficiency of GaN-Based Light-Emitting Diodes Via Surface Roughening", Applied Physics Letters, vol. 84, No. 6, Feb. 9, 2004, pp. 855-857.
Office Action issued Nov. 4, 2011 in Japanese Patent Application No. 2011-109921 (with English translation).
Office Action issued Dec. 11, 2012 in Korean Application No. 10-2012-8265 (With English Translation).
Partial European Search Report issued Jan. 28, 2013 in Patent Application No. 12151636.3.
Notice of Preliminary Rejection issued Jun. 25, 2013 in Korean Patent Application No. 10-2012-0008265 (with English translation).
The Extended European Search Report issued Aug. 6, 2013, in Application No. / Patent No. 12151636.3-1564 / 2525420.
Office Action issued Feb. 10, 2014, in Korean Patent Application No. 10-2013-0144036 with English translation.
Combined Chinese Office Action and Search Report issued Jul. 2, 2014 in Patent Application No. 201210017796.2 (with English translation of the Office Action and English translation of categories of cited documents).
Office Action issued Oct. 7, 2015 in Japanese Patent Application No. 2014-042057 (with English language translation).
Office Action issued Mar. 17, 2015 in Japanese Patent Application No. 2014-042057 (with English language translation).
Office Action issued Apr. 24, 2015 in European Patent Application No. 12151636.3.
Extended European Search Report issued Apr. 20, 2015 in Patent Application No. 14199507.6.

* cited by examiner

SEMICONDUCTOR LIGHT EMITTING DEVICE

CROSS-REFERENCE TO RELATED APPLICATION

This application is a divisional of U.S. application Ser. No. 13/222,302 filed Aug. 31, 2011, and is based upon and claims the benefit of priority from the prior Japanese Patent Application No.2011-109921, filed on May 16, 2011; the entire contents of each of which are incorporated herein by reference.

FIELD

Embodiments described herein relate generally to a semiconductor light emitting device.

BACKGROUND

As a semiconductor light emitting device, such as an LED (Light Emitting Diode), there is a structure in which a crystalline layer formed on, for example, a sapphire substrate is joined to a conductive substrate, then the sapphire substrate is removed. In the structure, in order to enhance light extraction efficiency, the surface of the crystal layer exposed by removing the sapphire substrate is subjected to unevenness processing. Moreover, there is also a structure in which no electrode is formed on the surface of the crystal layer to be a light extraction plane and a p-side electrode and an n-side electrode are formed on a crystal plane opposite to the surface from which the sapphire substrate is removed. In such a light emitting device, it is required to further improve the light extraction efficiency by enhancing the heat dissipation property.

DETAILED DESCRIPTION

In general, according to one embodiment, a semiconductor light emitting device includes a stacked structure body, a first electrode, a second electrode, and a dielectric body part. The stacked structure body includes a first semiconductor layer of a first conductivity type, having a first portion and a second portion juxtaposed with the first portion in a plane parallel to a layer surface of the first semiconductor layer, a light emitting layer provided on the second portion, a second semiconductor layer of a second conductivity type provided on the light emitting layer. The first electrode includes a contact part provided on the first portion and contacting the first semiconductor layer. The second electrode includes a first part provided on the second semiconductor layer and contacting the second semiconductor layer, and a second part electrically connected with the first part and including a portion overlapping with the contact part when viewed in a stacking direction from the first semiconductor layer toward the second semiconductor layer. The dielectric body part is provided between the contact part and the second part.

Various embodiments will be described hereinafter with reference to the accompanying drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

(First Embodiment)

Figure 1:
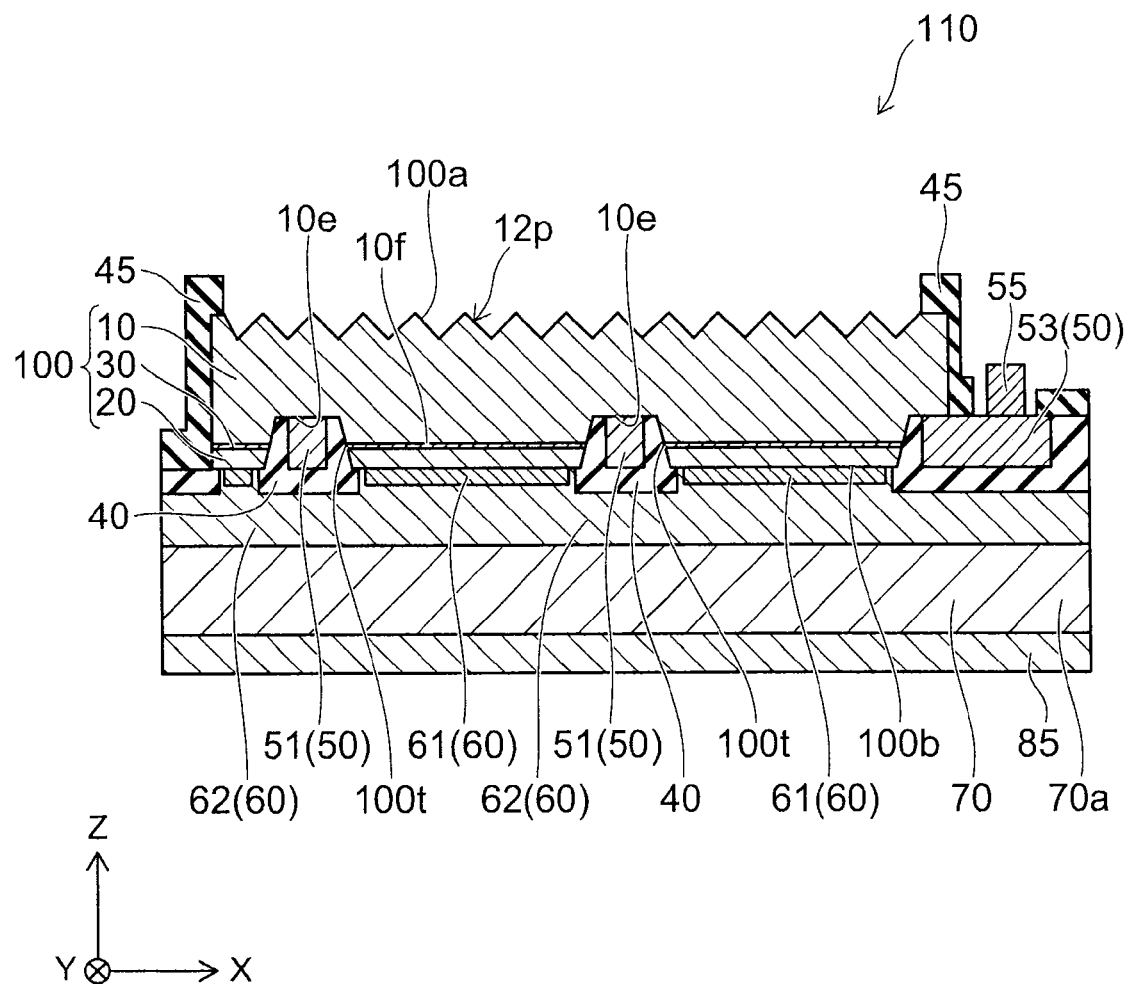
FIG. 1 is a schematic cross-sectional view illustrating a semiconductor light emitting device.

FIG. 1 is a schematic cross-sectional view illustrating a configuration of a semiconductor light emitting device according to a first embodiment.

Figure 2:
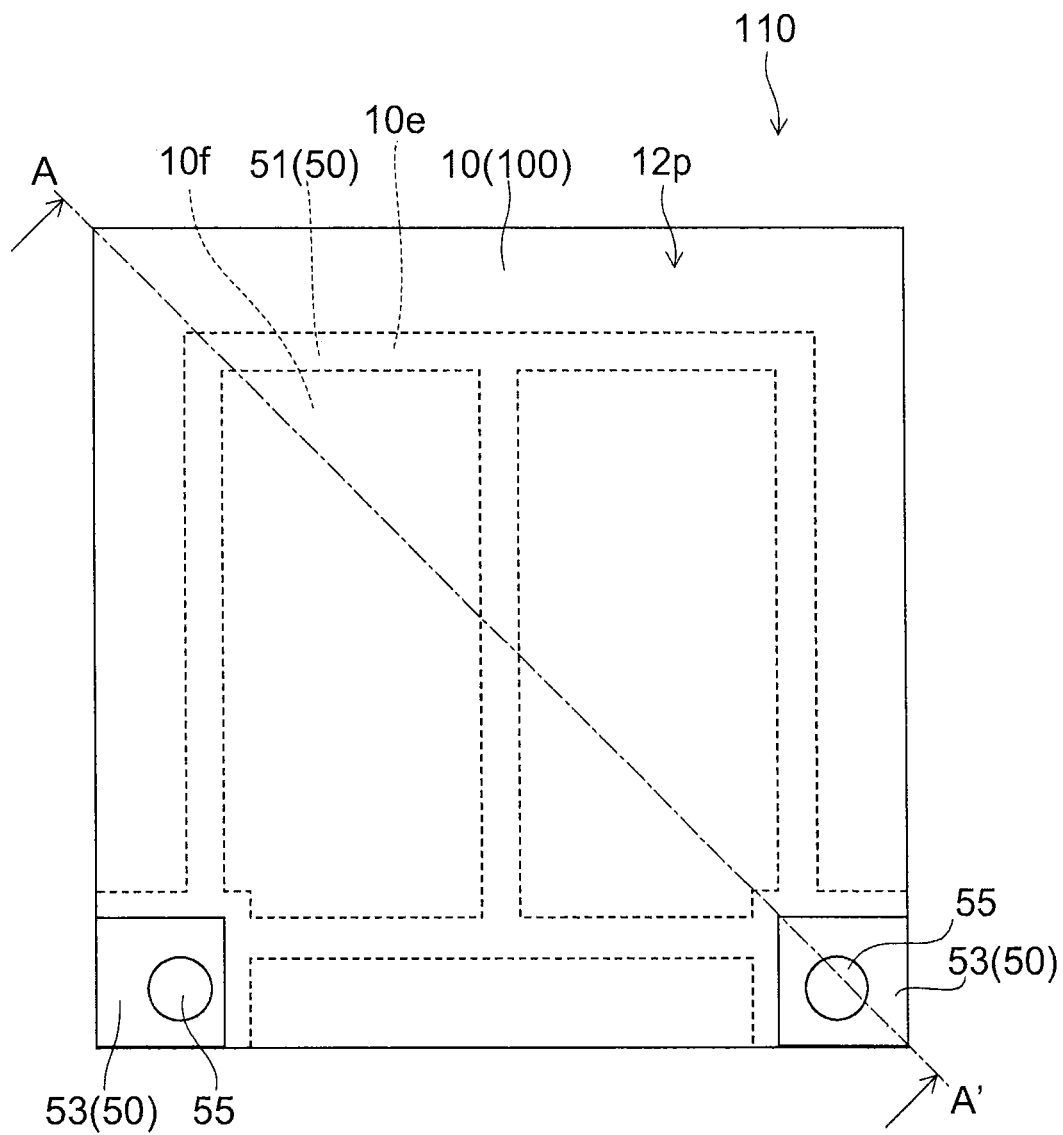
FIG. 2 is a schematic plan view illustrating the semiconductor light emitting device.

FIG. 2 is a schematic plan view illustrating the configuration of the semiconductor light emitting device according to the first embodiment.

Here, FIG. 1 illustrates the schematic cross-sectional view at line A-A' in FIG. 2.

As illustrated in FIG. 1, the semiconductor light emitting device 110 according to the first embodiment includes a stacked structure body 100, a first electrode 50, a second electrode 60, and a first dielectric body part 40.

The stacked structure body 100 includes a first conduction type first semiconductor layer 10, a second conduction type second semiconductor layer 20 facing a part of the first semiconductor layer 10, and a light emitting layer 30 provided between a part of the first semiconductor layer 10 and the second semiconductor layer 20.

The first conduction type is, for example, n-type. The second conduction type is, for example, p-type. The first conduction type may be p-type, and the second conduction type may be n-type. In the embodiment, a case where the first conduction type is n-type, and the second conduction type is p-type, will be exemplified.

The stacked structure body 100 has a first major surface 100a at the side of the first semiconductor layer 10, and a second major surface 100b at the side of the second semiconductor layer 20. Moreover, a part of the first semiconductor layer 10 is exposed to the side of the second major surface 100b. The part is an exposed part 10e of the first semiconductor layer 10.

The first electrode 50 includes a contact part 51 contacting the first semiconductor layer 10 at the exposed part 10e. The second electrode 60 contacts the second semiconductor layer 20 at the second major surface 100b.

The second electrode 60 includes a first part 61 contacting the second semiconductor layer 20 at the second major surface 100b, and a second part 62 electrically connected with the first part 61 and including a part overlapping with the contact part 51 viewed from a stacking direction from the first semiconductor layer 10 toward the second semiconductor layer 20.

Here, in the embodiment, Z-axis direction is referred to as a direction connecting the first semiconductor layer 10 and the second semiconductor layer 20, X-axis direction is referred to as one direction of two directions orthogonal to Z-axis direction, and Y-axis direction is a direction orthogonal to Z and X-axis directions. The stacking direction is in Z-axis direction.

Thus, the first semiconductor layer has a first portion (the exposed part 10e) and the second portion (other portion 10f). The second portion (the other portion 10f) is juxtaposed with the first portion in X-Y plane (a plane parallel to a layer surface of the first semiconductor layer 10).

The first dielectric body part 40 is provided between the contact part 51 and the second part 62.

That is, the second electrode 60 is electrically insulated from the first electrode 50 through the first dielectric body part 40. In the embodiment, the first dielectric body part 40 is provided only around the contact part 51 of the first electrode 50. Therefore, the first part 61 of the second electrode 60 contacts the second semiconductor layer 20 at a comparatively large area on which the first dielectric body part 40 is not provided at the side of the second major surface 100b of the stacked structure body 100. Accordingly, the heat generated in the stacked structure body 100 is efficiently dissipated to the exterior from the second electrode 60.

Next, a specific example of the semiconductor light emitting device 110 according to the embodiment will be described.

In the semiconductor light emitting device 110 according to the embodiment, the first semiconductor layer 10, the second semiconductor layer 20, and the luminescence layer 30 included in the stacked structure body 100 are, for example, nitride semiconductors. The first semiconductor layer 10, the second semiconductor layer 20, and the light emitting layer 30 are stacked on a growth substrate made of sapphire etc. through the use of, for example, a metal organic chemical vapor deposition process.

In the specification, "nitride semiconductor" is set as one of semiconductors having all compositions in which x, y and z are changed within respective ranges in a chemical formula of $B_xIn_yAl_zGa_{1-x-y-z}N$ ($0 \leq x \leq 1$, $0 \leq y \leq 1$, $0 \leq z \leq 1$, $x+y+z \leq 1$). Furthermore, in the above-mentioned chemical formula, one further including V group elements other than N (nitrogen), one further including various kinds of elements added to control various kinds of physical properties such as conductivity types, and one further including various kinds of elements contained unintentionally, are also included in "nitride semiconductor".

In the stacked structure body 100, a concave part 100t reaching the first semiconductor layer 10 from the second major surface 100b are provided. The bottom face of the concave part 100t includes the exposed part 10e of the first semiconductor layer 10. The contact part 51 of the first electrode 50 contacts the first semiconductor layer 10 at the exposed part 10e to achieve electrical connection with the first semiconductor layer 10.

A material capable of achieving good contact with the first semiconductor layer 10 is used in the contact part 51. As the contact part 51, for example, a stacking layer of Al/Ni/Au is used. The stacking layer is formed by stacking Al, Ni and Au on a contact face 50c in this order at a thickness of, for example, 300 nm.

Moreover, the first electrode 50 includes a lead part 53 drawn out to the exterior of the stacked structure body 100. The lead part 53 is electrically communicated with the contact part 51 and provided so as to extend to the exterior of the stacked structure body 100 from the contact part 51 along an X-Y plane. The lead part 53 may be formed integrally with the contact part 51.

The side face of the stacked structure body 100 is covered with the second dielectric body part 45. A part of the lead part 53 is exposed from the opening of the second dielectric body part 45 at the exterior of the stacked structure body 100. A pad electrode 55 is provided on the exposed portion.

A non-illustrated wiring member, such as a bonding wire, is connected to the pad electrode 55, and thus the exterior and the first semiconductor layer 10 can be electrically continuous with each other.

The first part 61 of the second electrode 60 is provided so as to contact the second semiconductor layer 20 along the second major surface 100b. In the first part 61, a material capable of efficiently reflecting emission light emitted from the light emitting layer 30 is used. In the first part 61, stacking layer of, for example, Ag/Pt is used. The stacking layer is formed by stacking Ag and Pt on the second major surface 100b in this order at a thickness of, for example, 200 nm.

The semiconductor light emitting device 110 according to the embodiment includes a support substrate 70 is electrically continuous with the second part 62 of the second electrode 60. The second part 62 of the second electrode 60 includes, for example, a bonding metal part. The whole of the second part 62 may be the bonding metal part.

In the bonding metal part, a material capable of achieving a good connection with the support substrate 70 to be described below is used. In the bonding metal part, stacking layer of, for example, Ti/Au is used. The stacking layer is formed by stacking Ti and Au on the second major surface 100b in this order at a thickness of, for example, 800 nm.

The support substrate 70 is joined to the bonding metal part. The support substrate 70 is made of a material having at least conductivity. Although, the material of the support substrate 70 is not limited in particular, for example, a substrate of a semiconductor such as Si and Ge, a plate of a metal such as CuW and Cu, and a thick film plated layer are used. Moreover, the substrate is not required to have a conductivity on the whole, and the substrate may be a resin substrate with a metal interconnect or the like.

In the embodiment, as an example of the material of the support substrate 70, Ge is used. The support substrate 70 is joined to the bonding metal part through a solder of, for example, Au/Su alloy (not illustrated).

A back face electrode 85 is provided to the support substrate 70. That is, the second semiconductor layer 20 is electrically continuous with the second electrode 60, the support substrate 70, and the back face electrode 85. Thus, mounting the semiconductor light emitting device 110 on a non-illustrated mounting substrate etc., enables to achieve electric communication between an electric communication part provided to the mounting substrate etc. and the second semiconductor layer 20.

The support substrate 70, viewed in X-axis direction, has an edge part 70a of the exterior of the stacked structure body 100. The lead part 53 of the first electrode 50 is drawn out from the contact part 51 to the edge part 70a.

In the semiconductor light emitting device 110, the second electrode 60 is a p-side electrode. Accordingly, the support substrate 70 and the back face electrode 85 electrically continuous with the second electrode 60 can achieve electric communication between the p-side electrode (the second electrode 60) and the exterior.

Moreover, in the semiconductor light emitting device 110, the first electrode 50 is an n-side electrode. Accordingly, connecting a wiring member such as a bonding wire to the pad electrode 55 allows obtaining electric communication between the n-side electrode (the first electrode 50) and the exterior.

In the semiconductor light emitting device 110, an uneven part 12p may be provided on the first major surface 100a (surface of the first semiconductor layer 10) of the stacked structure body 100. The uneven part 12p is constituted by a plurality of projections provided on a plane of the first major surface 100a.

Figure 3A:
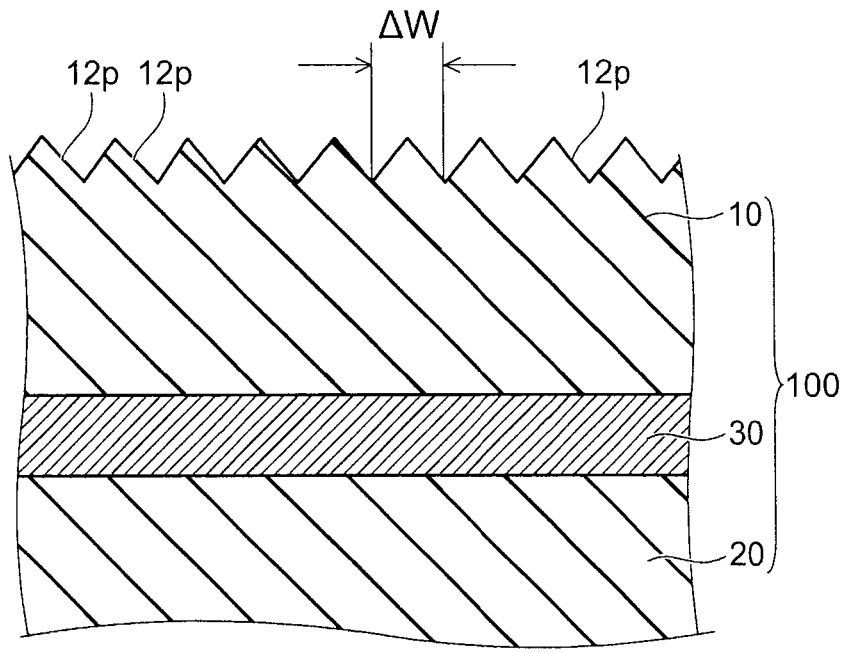
FIGS. 3A and 3B are partially enlarged views each illustrating the uneven part.
Figure 3B:
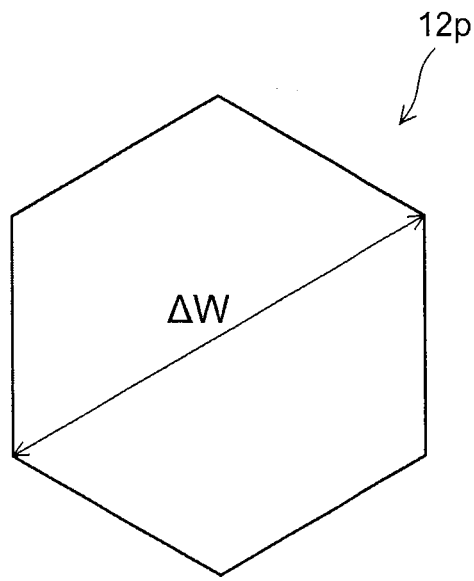

FIGS. 3A and 3B are partially enlarged views each illustrating the uneven part.

FIG. 3A is a schematic cross-sectional view of the uneven part.

FIG. 3B is a schematic plan view of one convex part.

As illustrated in FIG. 3A, the uneven part 12p is provided with a plurality of protrusions. The maximum width of the protrusions along X-axis direction is longer than a peak wavelength in the first semiconductor layer 10 of emission light radiated from the light emitting layer 30.

Thus, reflection of emission light at the interface of the first semiconductor layer 10 and the outside can be considered as Lambert reflection, thereby resulting in a higher improvement effect of light extraction efficiency. Where, "peak wavelength" is referred to as a wavelength of highest intensity light among emission light radiated from the light emitting layer 30. The peak wavelength is a wavelength corresponding to a peak value of spectrum distribution of the emission light. When a spectrum has two or more maximum values, each of which is not a noise level, a wavelength of either of them may be selected.

As illustrated in FIG. 3B, for example, when a nitride semiconductor is used in the first semiconductor layer 10, if a planar shape of the protrusions viewed in Z-axis direction is an approximate hexagon, the maximum width $\Delta W$ is the width between opposite diagonal vertices of the hexagon.

As an example, when the first semiconductor layer 10 is made of gallium nitride, and the peak wavelength of emission light of the light emitting layer 30 is 390 nm, the peak wavelength of emission light in the luminescence layer 10 becomes 155 nm. In this case, the improvement effect of light extraction efficiency can be achieved until the maximum width $\Delta W$ of the uneven part 12p reaches an order of 3 μm from a value exceeding 155 nm. Thus, it is preferable that the maximum width $\Delta W$ of the uneven part 12p is not less than twice the peak wavelength of the emission light, and it is more preferable that the maximum width $\Delta W$ is not less than ten times the peak wavelength.

In such semiconductor light emitting device 110, the quantity of light emitted from the light emitting layer 30 is larger at the side of the first major surface 100a than at the side of the second major surface 100b of the stacked structure body 100. That is, the first major surface 100a acts as a light extraction plane.

In the semiconductor light emitting device 110, neither the n-side electrode (the first electrode 50) nor the p-side electrode (the second electrode 60) is arranged at the first major surface 100a side of the stacked structure body 100. Accordingly, in this case, the light extraction efficiency at the first major surface 100a side is improved than a case where the electrodes are arranged on the side of the first major surface 100a. Furthermore, the p-side electrode (the second electrode 60) located directly below the light emitting layer 30, which is a main source of heat generation, is connected to a metal layer and the support substrate 70 with high thermal conductivity. If, for example, a heat sink is connected to the support substrate 70, heat resistance can be made low and good heat dissipation property can be achieved. In addition to this, the second part 62 of the p-side electrode (the second electrode 60) of the semiconductor light emitting device 110 is provided so as to extend along the second major surface 100b of the stacked structure body 100. For example, the support substrate 70 has the edge part 70a, which is located outer the stacked structure body 100a as viewed in the stacking direction. The second part 62 extends along the second major surface 100b to the edge part 70a. Thus, good heat diffusion can be achieved, enabling heat resistance of the whole of the semiconductor light emitting device 110 to be lower.

Figure 4:
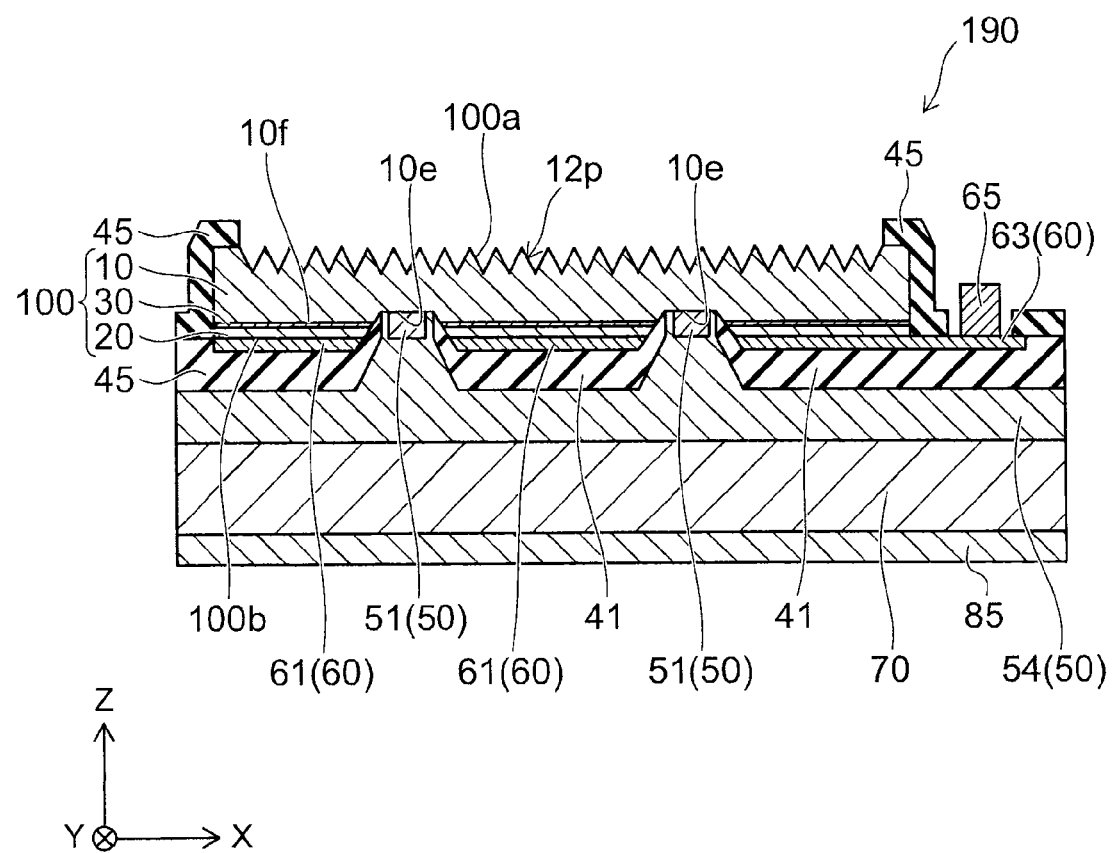
FIG. 4 is a schematic cross-sectional view illustrating a semiconductor light emitting device according to a reference example

FIG. 4 is a schematic cross-sectional view illustrating a configuration of a semiconductor light emitting device according to a reference example.

As illustrated in FIG. 4, in the semiconductor light emitting device 190 according to the reference example, a first electrode 50 includes a contact part 51 and a third part 54, which is electrically continuous with the contact part 51 and provided along a second major surface 100b. Furthermore, a third dielectric body part 41 is provided between the third part and a first part 61 of a second electrode 60 along Z-axis direction.

The second electrode 60 includes a first part 61 and a lead part 63, which electrically continuous with the first part 61 and is provided from the first part 61 the outside of a stacked structure body 100. A part of the lead part 63 is exposed from an opening of a second dielectric body part 45 at the exterior of the stacked structure body 100. A pad electrode 65 is provided on the exposed portion.

In such a semiconductor light emitting device 190, the third dielectric body part 41 is provided between the first part 61 of the second electrode 60 and the third part 54 of the first electrode 50. That is, the third dielectric body part 41 is formed to cover the whole of the first electrode 50 except the contact part 51 at the side of the second major surface 100b of the stacked structure body 100. Accordingly, a part located directly below the light emitting layer 30, which is a main source of heat generation, is covered with the third dielectric body part 41. Since the semiconductor light emitting device 190 is connected to a heat sink etc. through the third dielectric body part 41 with heat conductivity lower than that of a metal, heat resistance of the device 190 becomes high, thereby not being able to obtain sufficient heat dissipation property of the device 190. Furthermore, since, in order to improve the insulation property, it is necessary for the third dielectric body part 41 to be formed to be thick, the insulation property and the heat dissipation property of the device 190 are in a trade-off relation to each other.

In contrast, in the semiconductor light emitting device 110 according to the embodiment, a dielectric body is not provided directly below the light emitting layer 30. The second electrode 60 is located directly below the luminescence layer 30, and thus heat generated in the luminescence layer 30 spreads from the second electrode 60 to a side of the support substrate 70 and is easily dissipated outside. Accordingly, even if the first dielectric body part 40 is formed so as to be thick for the purpose of improving the insulation property, the heat dissipation property is not be reduced. Therefore, in the semiconductor light emitting device 110, the good insulation property and the good heat dissipation property can be achieved simultaneously.

Next, an example of a method for manufacturing the semiconductor light emitting device 110 will be described.

FIGS. 5A to 7B are schematic cross-sectional views sequentially illustrating an example of the method for manufacturing the semiconductor light emitting device.

Figure 5A:
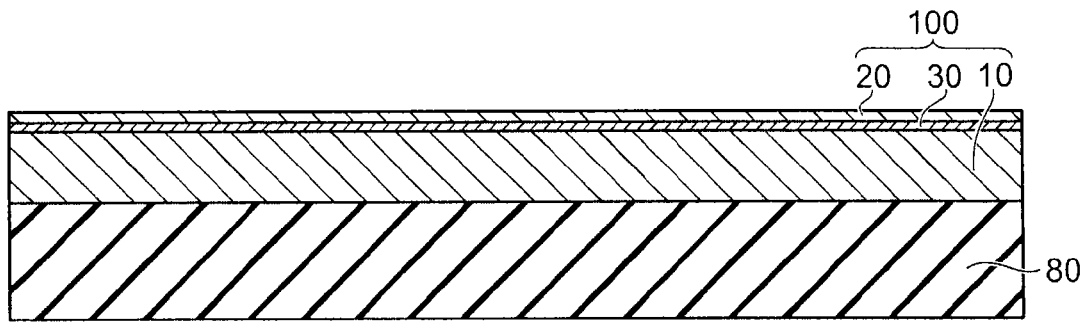
FIGS. 5A to 7B are schematic cross-sectional views sequentially illustrating a method for manufacturing the semiconductor light emitting device.

First, as illustrated in FIG. 5A, the first semiconductor layer 10, the light emitting layer 30, and the second semiconductor layer 20 are sequentially grown on the growth substrate 80 made of sapphire etc. Thus, the stacked structure body 100 is formed on the growth substrate 80.

The stacked structure body 100 is formed using, for example, a metal organic chemical vapor deposition process.

As a method for forming the stacked structure body 100, a well-known technology such as a molecular beam epitaxy growth process, may be used other than the metal organic chemical vapor deposition process.

As an example, the stacked structure body 100 is formed as follows.

First, as a buffer layer, a high carbon-concentration first AlN buffer layer (the carbon concentration is, for example, not less than $3\times10^{18}$ cm$^{-3}$ and not more than $5\times10^{20}$ cm$^{-3}$, and the thickness is, for example, 3 nm to 20 nm), a high purity second AlN buffer layer (the carbon concentration is, for example, not less than $1\times10^{16}$ cm$^{-3}$ and not more than $3\times10^{18}$ cm$^{-3}$, and the thickness is 2 µm), and a non-doped GaN buffer layer (the thickness is, for example, 2 µm) are formed in this order on a growth substrate 80, the surface of which is made up of sapphire c-plane. The first AlN buffer layer and the second AlN buffer layer mentioned above are layers made up of single crystal aluminum nitride. By using single crystal aluminum nitride layers as the first AlN buffer layer and the second AlN buffer layer, a high quality semiconductor layer can be formed in crystal growth described later, resulting in significant reduction of damage to a crystal.

Next, a Si doped n-type GaN contact layer (the Si concentration is, for example, not less than $1\times10^{18}$ cm$^{-3}$ and not more than $5\times10^{19}$ cm$^{-3}$, and the thickness is 6 µm), and a Si doped n-type Al$_{0.10}$Ga$_{0.90}$N cladding layer (for example, the Si concentration is $1\times10^{18}$ cm$^{-3}$ and the thickness is 0.02 µm) are formed thereon in this order. The Si doped n-type GaN contact layer and the Si doped n-type Al$_{0.10}$Ga$_{0.90}$N cladding layer constitute the first semiconductor layer 10. For convenience, all or a part of the above-mentioned GaN buffer layers may be included in the first semiconductor layers 10.

Here, the buffer layer formed on the growth substrate 80 is not limited to AlN mentioned above. For example, a thin film made up of Al$_x$Ga$_{1-x}$N (0≤x≤1) grown at a low-temperature may be used.

Next, as a luminescence layer 30, a Si doped n-type Al$_{0.11}$Ga$_{0.89}$N barrier layer, a GaInN well layer, are alternately stacked thereon for three periods, and then a final Al$_{0.11}$Ga$_{0.89}$N barrier layer with multi quantum wells is further stacked thereon. In the Si doped n-type Al$_{0.11}$Ga$_{0.89}$N barrier layer, the Si concentration is, for example, not less than $1.1\times10^{19}$ cm$^{-3}$ and not more than $1.5\times10^{19}$ cm$^{-3}$. In the final Al$_{0.11}$Ga$_{0.89}$N barrier layer, the Si concentration is, for example, not less than $1.1\times10^{19}$ cm$^{-3}$ and not more than $1.5\times10^{19}$ cm$^{-3}$, and the thickness is, for example, 0.01 µm. The thickness of such a multi quantum wells structure is, for example, 0.075 µm. Subsequently, a Si doped n-type Al$_{0.11}$Ga$_{0.89}$N layer (the Si concentration is, for example, not less than $0.8\times10^{19}$ cm$^{-3}$ and not more than $1.0\times10^{19}$ cm$^{-3}$, and the thickness is, for example, 0.01 µm) is formed thereon. The wavelength of the emission light in the light emitting layer 30 is, for example, not less than 370 nm and not more than 480 nm, or not less than 370 nm and not more than 400 nm.

Furthermore, as a second semiconductor layer 20, a non-doped Al$_{0.11}$Ga$_{0.89}$N spacer layer (the thickness is, for example, 0.02 µm), a Mg doped p-type Al$_{0.28}$Ga$_{0.72}$N cladding layer (the Mg concentration is, for example, $1\times10^{19}$ cm$^{-3}$, and the thickness is, for example, 0.02 µm), and a Mg doped p-type GaN contact layer (the Mg concentration is, for example, $1\times10^{19}$ cm$^{-3}$, and the thickness is, for example, 0.4 µm), and a high concentration Mg doped p-type GaN contact layer (the Mg concentration is, for example, $5\times10^{19}$ cm$^{-3}$, and the thickness is, for example, 0.02 µm) are formed thereon one by one in this order.

The above-mentioned compositions, compositional ratios, kind of impurities, impurity concentrations, and thicknesses are one of examples, and various modifications with regard to the example are possible.

By setting the Mg concentration of the high concentration Mg doped p-type GaN contact layer to a higher value of $1\times10^{20}$ cm$^{-3}$, the ohmic characteristics with respect to the second electrode 60 can be improved. However, in the case of a semiconductor light emitting diode, unlike a semiconductor laser diode, the distance between the high-concentration Mg doped p-type GaN contact layer and the light emitting layer 30 is near, and thus the degradation of characteristics due to Mg diffusion is a concern. Therefore, by suppressing the Mg concentration of the high concentration Mg doped p-type GaN contact layer to be approximately $1\times10^{19}$ cm$^{-3}$ without significant degradation of the electric properties, Mg diffusion can be suppressed, thereby resulting in improvement of the light emission characteristics.

Moreover, the high carbon concentration first AlN buffer layer has a function to relax difference in crystal type with respect to the growth substrate 80, and especially it reduces screw dislocation. Moreover, the surface of the high purity second AlN buffer layer is made flat at the atomic level. Therefore, crystal defects of the non-doped GaN buffer layer grown thereon are reduced. In order to sufficiently reduce the crystal defects, it is preferable to make film thickness of the second AlN buffer layer thicker than 1 µm. Moreover, in order to suppress warpage due to distortion, it is preferable to make the film thickness of the second AlN buffer layer to be not more than 4 µm. The material of the high purity second AlN buffer layer is not limited to AlN, instead, Al$_x$Ga$_{1-x}$N (0.8≤x≤1) may be used as the material and it can compensate the warpage of the growth substrate 80.

Moreover, the non-doped GaN buffer layer is grown in the shape of a three-dimensional island on the high purity second AlN buffer layer. Thus, the non-doped GaN buffer layer plays a role in reducing crystal defects. In order to make the growth surface flat, it is preferable that the average film thickness of the non-doped GaN buffer layer is not less than 2 µm. In view of reproducibility and warpage reduction, it is preferable that the total film thickness of the non-doped GaN buffer layer is not less than 2 µm and not more than 10 µm.

By adopting such a buffer layer, the crystal defects can be reduced to approximately 1/10 compared with those of a case where the AlN buffer layer grown at a low temperature is adopted. Although this technology makes use of high concentration Si doping to the n-type GaN contact layer and light emission at a frequency band of ultraviolet light, a high efficiency semiconductor light emitting device is manufactured through the use of the technology. Furthermore, by reducing the crystal defects in the non-doped GaN buffer layer, light absorption in the non-doped GaN buffer layer is also suppressed.

Although the light emission wavelength of the quantum well layer is not limited in particular, when using for example, a gallium nitride based compound semiconductor made up of GaInN, 375 to 700 nm luminescence is achieved. Moreover, the buffer layer on the sapphire substrate is not limited in particular, and a Al$_x$Ga$_{1-x}$N (0≤x≤1) thin film grown at a low-temperature may be used.

Figure 5B:
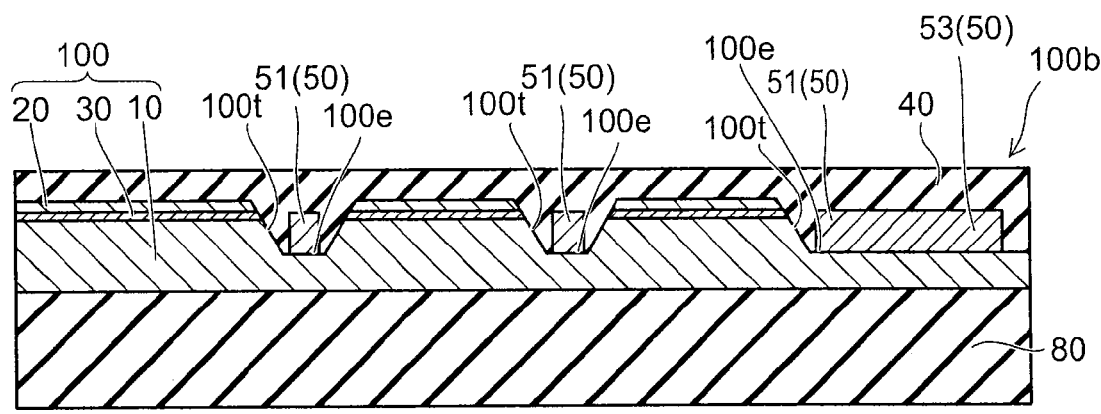

Next, as illustrated in FIG. 5B, the concave part 100t is formed in a part of the stacked structure body 100. The concave part 100t reaches the first semiconductor layer 10 from the second major surface 100b of the stacked structure body 100. Thus, the first semiconductor layer 10 is exposed to the bottom of the concave part 100t (exposed part 10e).

In order to form the concave part 100*t*, a non-illustrated mask is formed on the second major surface 100*b* of the stacked structure body 100, and is subjected to, for example, dry etching. That is, an opening is provided in the mask at a portion to be formed with the concave part 100*t*, and the stacked structure body 100 is removed from the second major surface 100*b* to the first semiconductor layer 10 by means of etching. Thus, the concave part 100*t* is formed. Although the angle of the internal face of the concave part 100*t* is not limited in particular, it is preferable that the angle is not less than 60° as an angle for reflecting emission light from the light emitting layer 30, having maximum intensity at 30°, in a direction opposite to the advancing direction. Although the depth of the concave part 100*t* is not limited in particular, as the depth becomes deeper the light extraction efficiency is improved more easily by changing the advancing direction of emission light propagating inside the stacked structure body 100 in a transverse direction. In contrast, if the depth is too deep, it becomes difficult to fill the concave part 100*t* with solder, in bonding the support substrate 70 at a later process. Furthermore, if the depth of the concave part 100*t* is made deep until it reaches to the non-doped GaN buffer layer, it becomes impossible to form the first electrode 50 in the Si doped n-type GaN contact layer. Accordingly, the depth of the concave part 100*t* is made to be, for example, not less than 0.6 μm and not more than 6.6 μm, preferably, not less than 1.0 μm and not more than 3.0 μm.

Next, as illustrated in FIG. 5B, the first electrode 50 contacting the first semiconductor layer 10 is formed. For the first electrode 50, first, a stacking layer of Ti/Al/Ni/Au to be an ohmic electrode is formed on an exposed face 100*e* of the first semiconductor layer 10 exposed from the concave part 100*t*, at a film thickness of, for example, 300 nm, and the stacking layer is sintered at 600° C. for 5 minutes in a nitrogen atmosphere.

Next, as a metal for current diffusion, a joint metal for the lead part 53 to the pad electrode 55, and an adhesion metal to an insulating layer, a stacking layer of, for example, Ti/Au/Ti is formed on an ohmic electrode at a film thickness of, for example, 1200 nm.

The material for the first electrode 50 is not limited to one mentioned above. For example, if Al is used as a material for a first layer, the light extraction efficiency and the design degree of freedom of the first electrode 50 is improved, because, the first layer acts as a reflection electrode while achieving good ohmic characteristics and low contact characteristics with respect to the n-type contact layer. Since Al has a poor environmental resistance, for example, by adopting an Al alloy mixed with slight Si, the reliability and the adhesion property of the electrode can be improved.

Next, the first dielectric body part 40 is formed so as to cover the first electrode 50 and the concave part 100*t*. As the first dielectric body part 40, for example, a film of $SiO_2$ is formed at the film thickness of 800 nm.

Here, when forming a film of the first dielectric body part 40, film formation by high temperature growth can be applied. That is, since the first electrode 50 formed previously is sintered at about 600° C., it has heat-resistance to comparable heat treatment conditions. Accordingly, film formation of the first dielectric body part 40 may be formed at a sufficiently high temperature. Therefore, the first dielectric body part 40 becomes a high quality film excellent in the insulation property, the coverage, the reliability and so on.

Figure 5C:
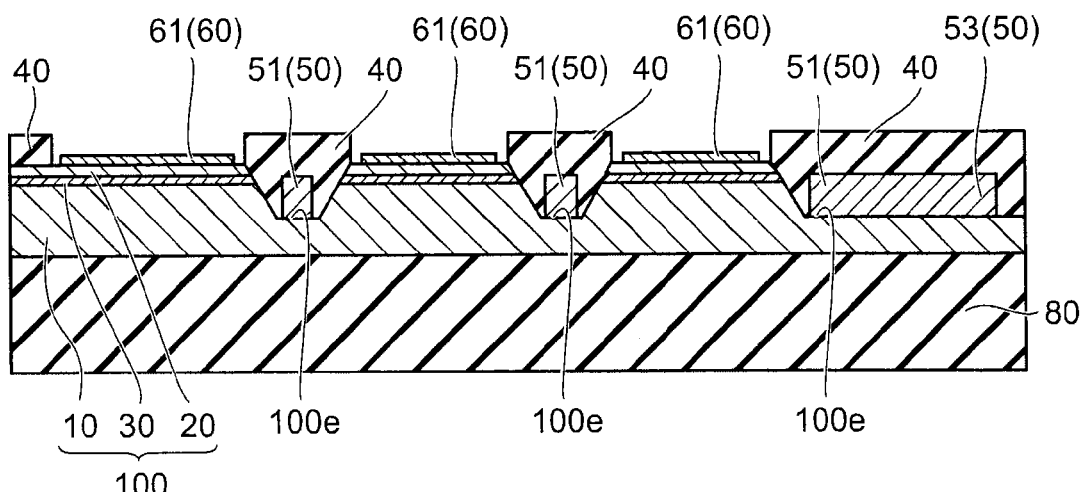

Next, as illustrated in FIG. 5C, in order to form the second electrode 60 with ohmic characteristics, the first dielectric body part 40 on the second semiconductor layer 20 is removed. Then, a stacking layer of Ag/Pt to be an ohmic electrode is formed on the surface of the second semiconductor layer 20 exposed by removing the first dielectric body part 40 at a thickness of, for example, 200 nm. Then, a first part 61 of the second electrode 60 is formed by sintering the stacking layer at about 400° C. for one minute in an oxygen atmosphere.

The second electrode 60 at least contains silver or silver alloy. Although reflection efficiency of an usual metal single layer film in the visible light frequency band tends to decrease as the wavelength becomes shorter in the ultraviolet frequency band not more than 400 nm, silver has high reflection efficiency characteristics high even for light in the ultraviolet frequency band not less than 370 nm and not more than 400 nm. Therefore, when the second electrode 60 is made of a silver alloy in a semiconductor light emitting device of ultraviolet emission, it is desirable for the second electrode 60 on the semiconductor interface side to have a larger silver component ratio. In order to ensure the reflection efficiency for light, it is preferable that the film thickness of the second electrode 60 is not less than 100 nm.

Figure 6A:
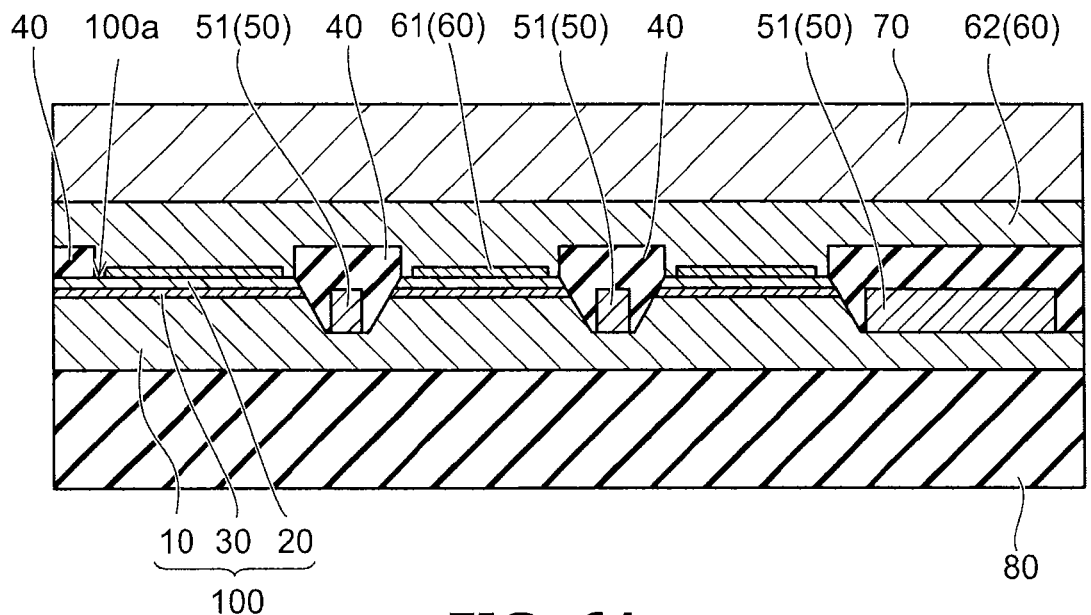

Next, as illustrated in FIG. 6A, on the whole of the surfaces on which the first part 61 and the first dielectric body part 40 are exposed, a stacking layer of, for example, Ti/Pt/Au is formed as a second part 62 to be a joint metal, at a film thickness of, for example, 800 nm.

Next, the support substrate 70 made of, for example, Ge is prepared. On the major surface of the support substrate 70, for example, a solder (not illustrated) composed of an AuSn alloy is provided at a film thickness of 3 μm. Then, while facing the second part 62 and the solder to each other, the substrate 70 and the stacked structure 100 are heated to a temperature of, for example, 300° C., exceeding the eutectic point of the solder. Thus, the support substrate 70 is joined to the side of the second major surface 100*b* of the stacked structure body 100.

Figure 6B:
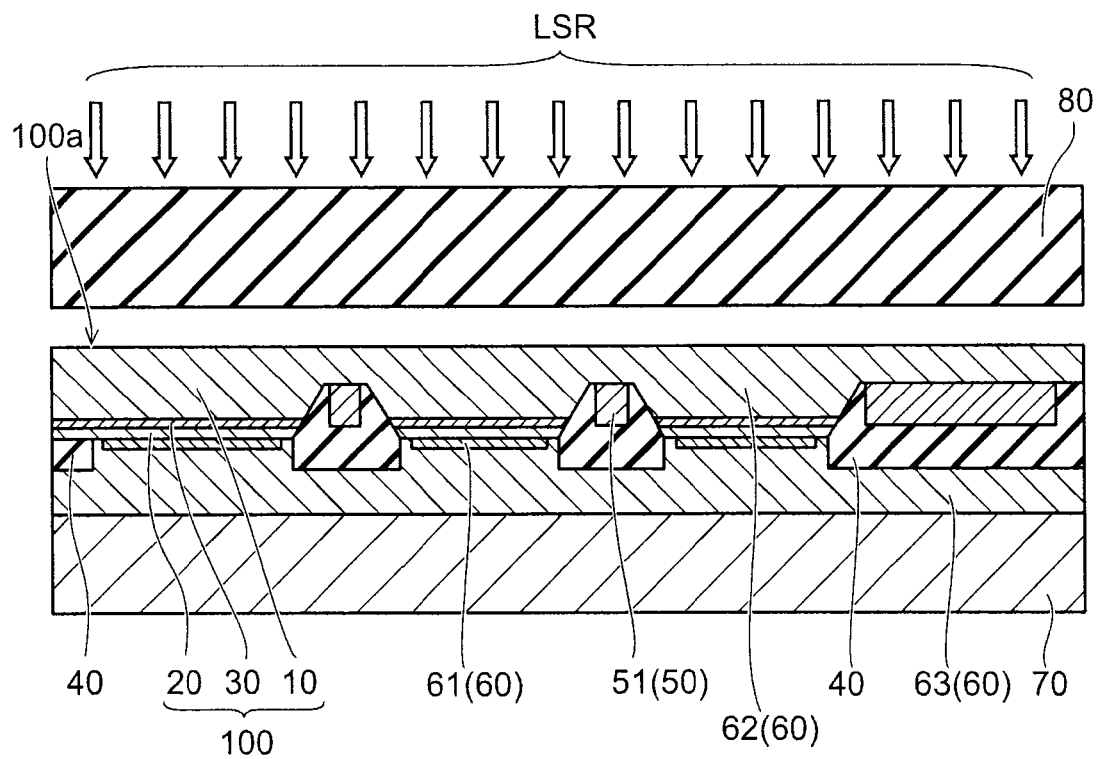

Then, as illustrated in FIG. 6B, the stacked structure body 100 is irradiated with laser light LSR of the third harmonic (355 nm) or the fourth harmonic (266 nm) of a solid-state laser of, for example, $YVO_4$ from the side of the growth substrate 80. The wavelength of the laser light LSR is shorter than the band-gap wavelength based on the band gap of GaN in a GaN buffer layer (for example, the above-mentioned non-doped GaN buffer layer). That is, the laser light LSR has energy higher than the band gap of GaN.

This laser light LSR is efficiently absorbed in an area at the side of a single crystal AlN buffer layer (in this example, the second AlN buffer layer) in the GaN buffer layer (non-doped GaN buffer layer). Thus, GaN at the side of the single crystal AlN buffer layer in the GaN buffer layer is decomposed by heat generation.

When adhering the crystal layer on the sapphire substrate (the growth substrate 80) and the support substrate 70 together, or when releasing the sapphire substrate (the growth substrate 80) from the support substrate 70 by decomposing GaN through the use of the laser light LSR, crystal defects and damages tend to occur in the crystals due to difference in the thermal expansion coefficient between the support substrate 70 and sapphire or GaN, heat generated by local heating, products generated when GaN decomposes, and the like. If the crystal defects and damages are generated, Ag of the second electrode 60 diffuses, thereby accelerating increase of leakages in the crystals and crystal defects.

According to the embodiment, since a high quality semiconductor layer can be formed through the use of a single crystal AlN buffer layer, the damages to crystals are significantly reduced. Furthermore, when decomposing GaN with the laser light LSR, heat is diffused into the AlN buffer layer located in the immediate vicinity of GaN and exhibiting high thermal conduction characteristics, and thus the crystals are hardly damaged by the heat due to local heating.

Then, the decomposed GaN is removed by a hydrochloric acid treatment etc. to release the growth substrate 80 from the stacked structure body 100. Thus, the growth substrate 80 and the stacked structure body 100 are separated.

Next, the formation of unevenness and the pad electrode 55 is carried out on the exposed first major surface 100a of the stacked structure body 100.

Figure 7A:
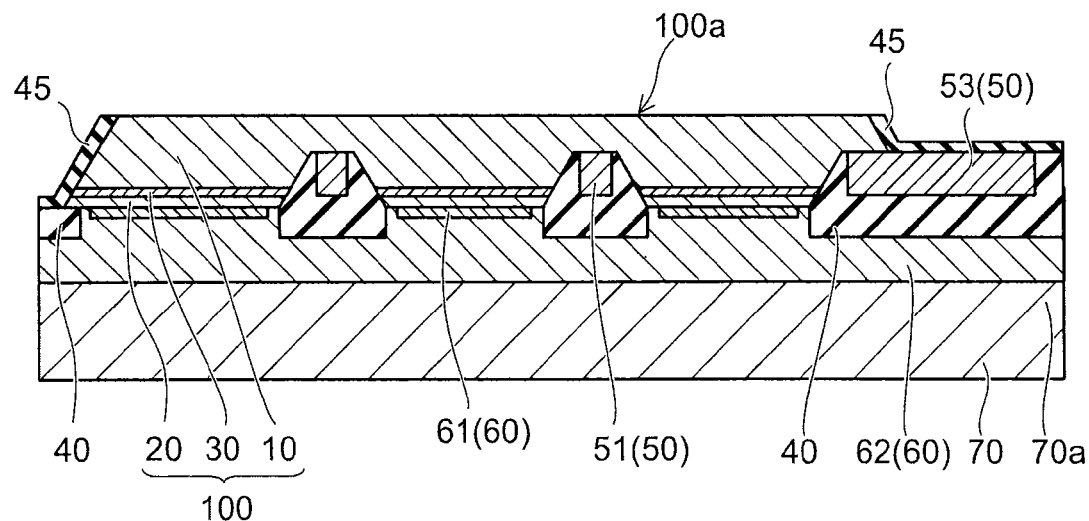

First, as illustrated in FIG. 7A, a part of the stacked structure body 100 is removed by dry etching to expose a part of the first electrode 50 (the lead part 53). Next, the second dielectric body part 45 is formed on the entire face of the first major surface 100a of the stacked structure body 100, and an opening is provided in a portion thereof. In the second dielectric body part 45, for example, $SiO_2$ is used. The film thickness of the second dielectric body part 45 is, for example, 800 nm. From the opening of the second dielectric body part 45, the surface of, for example, a non-doped GaN buffer layer is exposed.

Figure 7B:
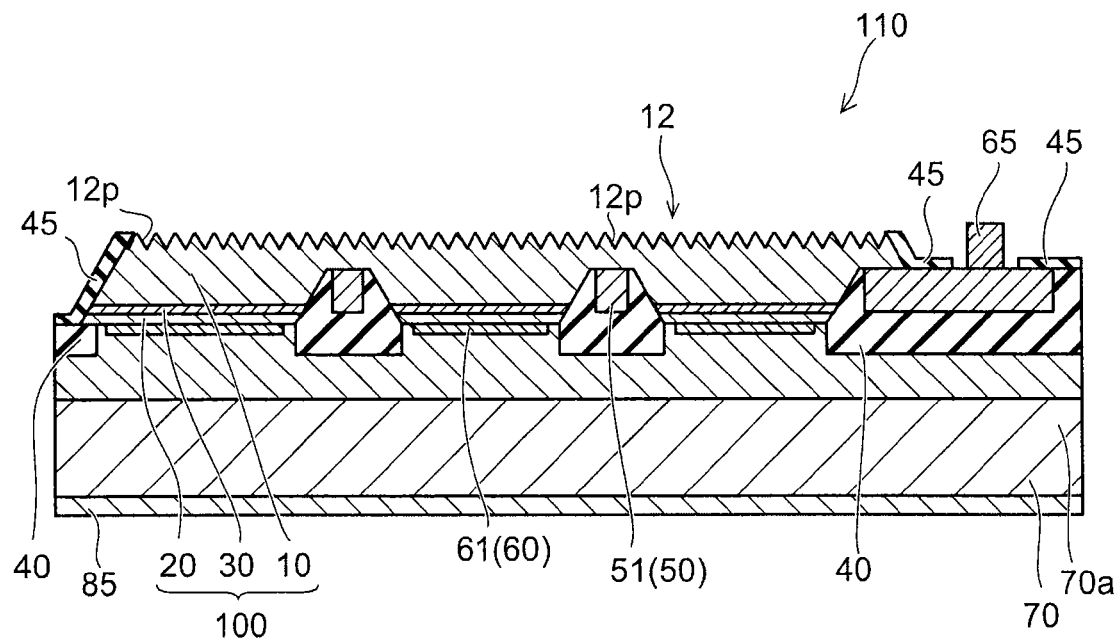

Next, as illustrated in FIG. 7B, through the use of the second dielectric body part 45 provided with the opening as a mask, the surface of the non-doped GaN buffer layer is processed by alkali etching using, for example, a KOH solution to form the uneven part 12p. As etching conditions, for example, the KOH solution of 1 mol/liter is heated to 80° C., and etching is carried out for 20 minutes.

The uneven part 12p may be formed on the n-type contact layer. However, in order to form low resistance ohmic contact with the n-side electrode (first electrode 50), career concentration (for example, impurity concentration) of the n-type contact layer is set to be high. When forming unevenness and a flat part on the n-type contact layer, surface roughening and impurity precipitation may occur, resulting in factors of reducing light extraction efficiency. In contrast, the impurity concentration of the GaN buffer layer is lower than that of the n-type contact layer, which is therefore advantageous in that surface roughening and impurity precipitation hardly occur.

Here, in the method of forming uneven part 12p, wet etching as mentioned above may be used, or dry etching may be used. For alkali etching using a KOH solution etc., anisotropic etching is carried out with respect to the buffer layer along the plane direction (mainly {1 0 –1 –1}) of each GaN crystal, resulting in formation of a structure of six-sided pyramids. Moreover, the etching rate, and the dimension and density of the six-sided pyramids are changed largely depending on the hydrogen ion exponent (pH) (adjustable by an etching temperature, an etching time, and addition of another substance), concentration, presence of radiation of ultraviolet (UV) light and UV laser, and the like.

In general, as the amount of etching (depth from the surface before etching to the deepest place of the uneven part 12p made after etching) becomes larger, the uneven part 12p formed becomes larger and denser. When processing GaN by dry etching, unlike a Ga plane, an N plane tends to be influenced by crystal orientation or dislocation, and can be easily subjected to anisotropic etching. The surface of GaN grown on the c-plane sapphire substrate is usually the Ga plane, and the surface of GaN exposed by removing the sapphire substrate like the embodiment is the N plane. Accordingly, it is easy to form the uneven part 12p by anisotropic etching using dry etching. The uneven part 12p may also be formed by anisotropic etching using a mask. Thus, the uneven part 12p as designed can be formed, thereby allowing the improvement of light extraction efficiency.

The uneven part 12p is provided for purposes of, for example, extracting incident emission light effectively or changing an incident angle. Therefore, it is preferable that the dimension of the uneven part 12p is larger than that of the wavelength of the emission light in the crystal layer. If the dimension of the uneven part 12p is smaller than that of the wavelength of the emission light, at the interface of the uneven part 12p, the incident emission light in the uneven part 12p exhibits phenomena, such as scattering and diffraction, which can be explained by wave optics. Thus, a part of emission light originally being penetrated therethrough is not extracted. Furthermore, if the dimension of the uneven part 12p is sufficiently smaller than that of the wavelength of the emission light, the uneven part 12p is considered as a layer in which its refractive index is continuously changed. Therefore, the layer acts like a flat plane without unevenness, not allowing the improvement of the light extraction efficiency.

According to experimental results using a semiconductor light emitting device (the wavelength of emission light in a crystal layer is about 155 nm) having a wavelength of emission light of 390 nm, produced in the embodiment, a tendency that as the dimension of the uneven part 12p became larger the optical output increased, was demonstrated. The tendency of increase of the output moderately continued until the dimension of the uneven part 12p became to an order of 3 μm. Thus, it was found it is preferable that the dimension of the uneven part 12p is not less than twice that of the emission light in the crystal layer, and further preferable that the dimension of the uneven part 12p is to be not less than ten times.

Next, a part of the second dielectric body part 45 covering the lead part 53 is removed, and the pad electrode 55 is formed on a part of the exposed lead part 53. As a pad electrode 55, a stacking layer of, for example, Ti/Pt/Au is used. The film thickness of the pad electrode 55 is 800 nm, for example. A bonding wire is connected to the pad electrode 55.

Then, the support substrate 70 is ground to a thickness of about 100 μm by grinding etc. and a stacking layer of, for example, Ti/Pt/Au is formed on the ground surface at a thickness of, for example, 800 nm as a back face electrode 85. The back face electrode 85 is connected to a heat sink or a package.

Subsequently, if necessary, the support substrate 70 is cut out by using cleavage or a diamond blade etc. Thus, the semiconductor light emitting device 110 is completed.

Although in the above-mentioned manufacturing method, an example in which the sapphire substrate is used as the growth substrate 80 is shown, a Si substrate may be used as the growth substrate 80. Furthermore, when the Si substrate is used as the growth substrate 80, instead of using radiation of laser light LSR, a treatment for removing the growth substrate 80 may be carried out by grinding the Si substrate to a certain degree of thickness and subsequently removing the remaining Si substrate by etching.

(Second Embodiment)

Figure 8:
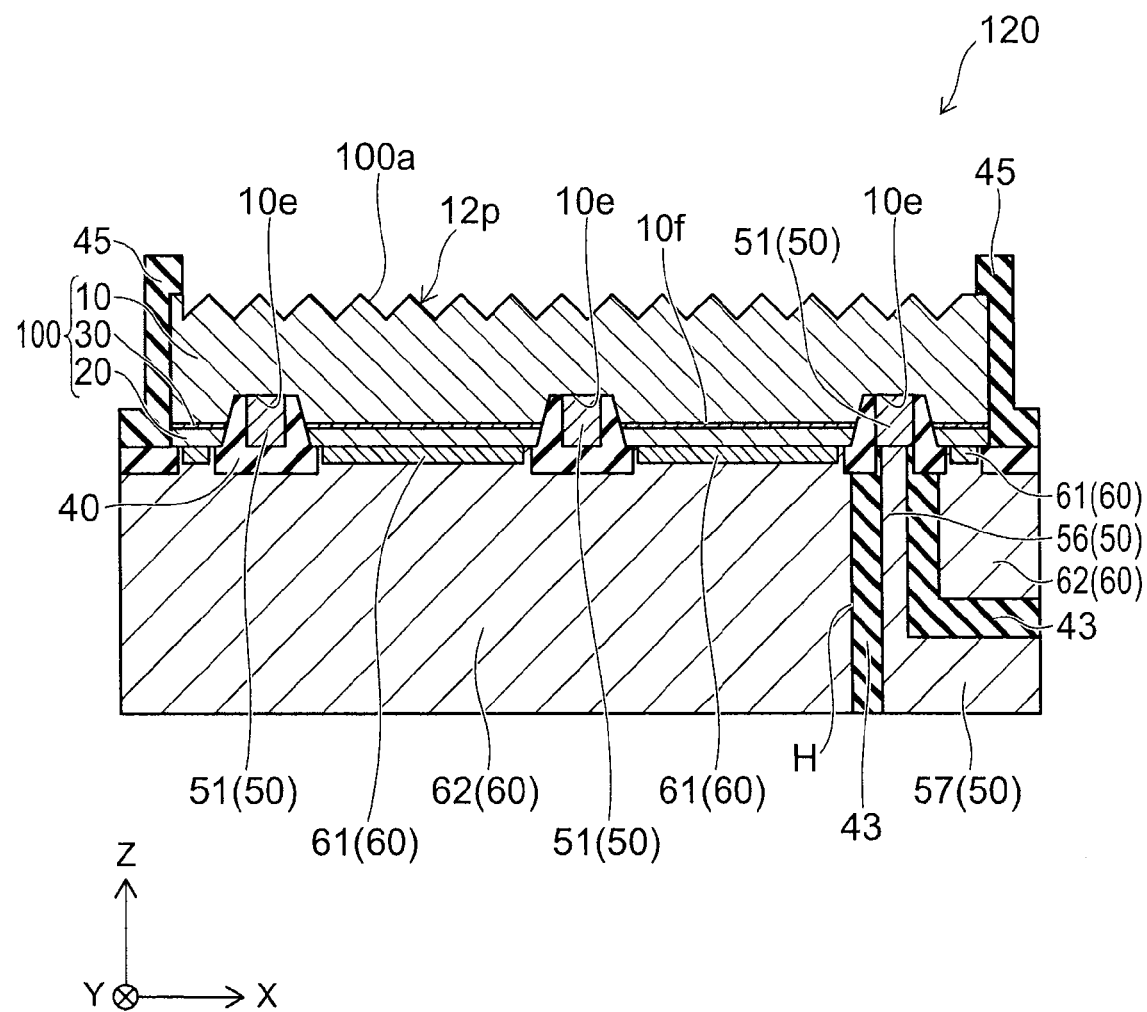
FIG. 8 is a schematic cross-sectional view illustrating the semiconductor light emitting device.

FIG. 8 is a schematic cross-sectional view illustrating a configuration of a semiconductor light emitting device according to a second embodiment.

Figure 9:
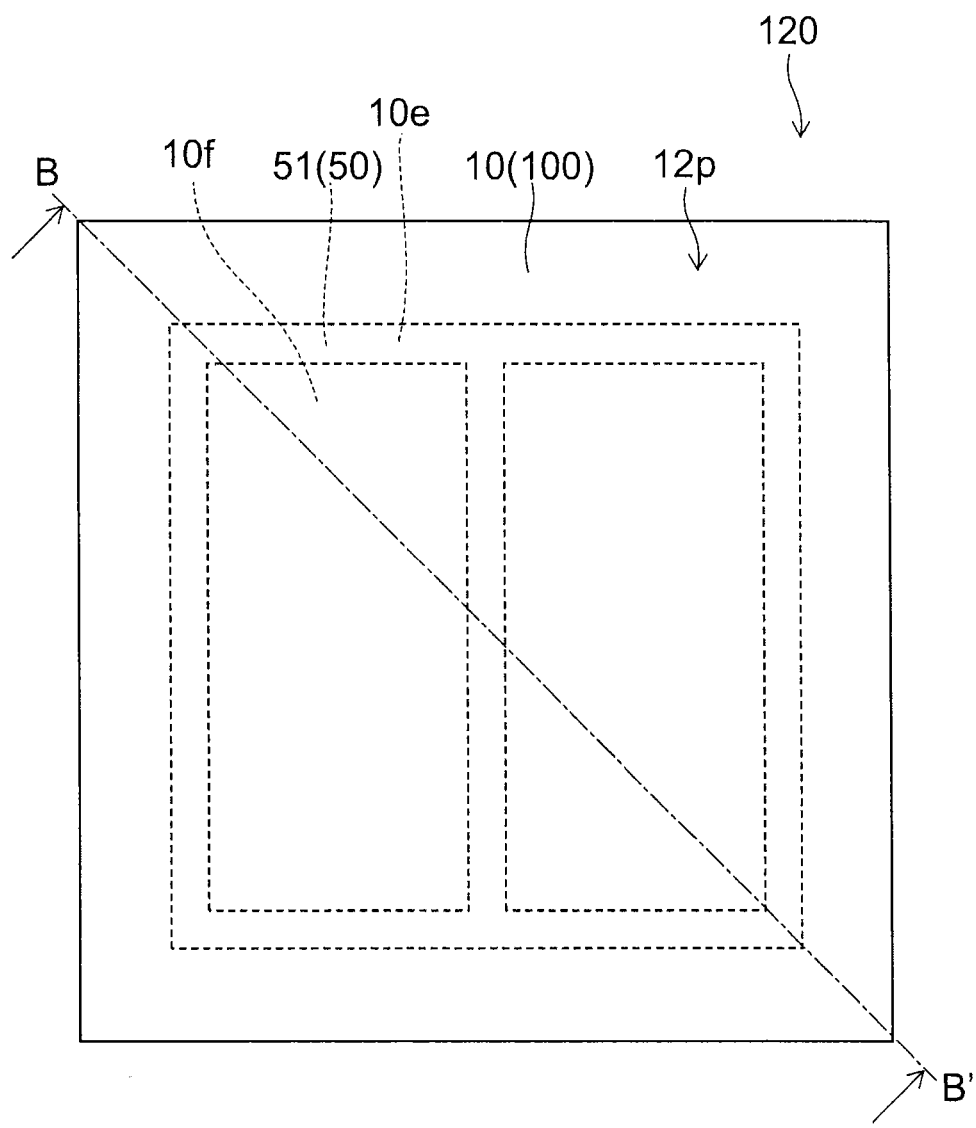
FIG. 9 is a schematic plan view illustrating the semiconductor light emitting device.

FIG. 9 is a surface-side schematic plan view illustrating the configuration of the semiconductor light emitting device according to the second embodiment.

Figure 10:
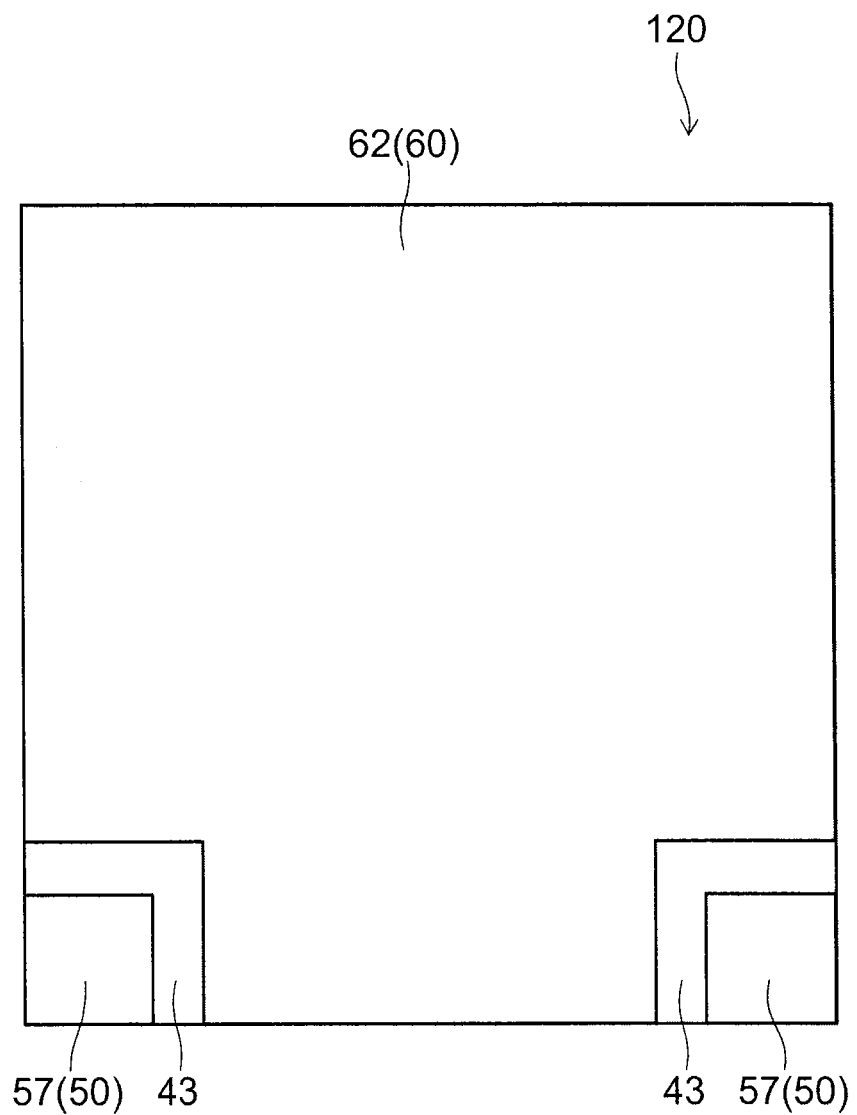
FIG. 10 is a schematic plan view illustrating the semiconductor light emitting device

FIG. 10 is a back-face-side schematic plan view illustrating the configuration of the semiconductor light emitting device according to the second embodiment.

Here, FIG. 8 illustrates the schematic cross-sectional view at line B-B' in FIG. 9.

As illustrated in FIG. 8, the semiconductor light emitting device 120 according to the second embodiment includes a stacked structure body 100, a first electrode 50, a second electrode 60, and a first dielectric body part 40. The semiconductor light emitting device 120 also includes a pad electrode 57 electrically continuous with the first electrode. The pad electrode 57 is arranged in parallel with a second part 62 of the second electrode.

A via part 56 is provided between the pad electrode 57 and a contact part 51 of the first electrode 50. The via part 56 extends along Z-axis direction. For example, the via part 56 is formed inside a hole H penetrating through the second part 62 of the second electrode 60 in Z-axis direction. The via part 56 is formed inside the hole H through an embedding insulator part 43. For the embedding insulator part 43, for example, a dielectric material ($SiO_2$ etc.) is used. For the embedding insulator part 43, a resin may also be used. The via part 56 electrically connect the pad electrode 57 to the contact part 51. The via part 56 may be included in the first electrode 50.

In the semiconductor light emitting device 120, the second part 62 of the second electrode 60 is formed, for example, with a plated metal. That is, the second part 62 is formed by metal plating. As the plated metal, for example, Cu is used. By metal plating, the second part 62 is formed at a thickness of about 200 μm. Thus, the second part 62 is given sufficient strength, and can be used as the support substrate 70 (refer to FIG. 1).

The second electrode 60 may be formed by plating the first part 61 and the second part 62.

As mentioned above, in the semiconductor light emitting device 120, the pad electrode 57 is arranged in parallel with the second part 62 of the second electrode 60. That is, in the semiconductor light emitting device 120, both the first electrode 50 and the second electrode 60 are arranged at the opposite side (the side of a second major surface 100b) with a light extraction plane (a first major surface 100a) of the stacked structure body 100. The first electrode 50 and the second electrode 60 are not arranged on the light extraction plane (refer to FIGS. 8 and 9). Accordingly, the area of the light extraction plane can be enlarged than that of a light emitting device in which an electrode is arranged at the side of the light extraction plane. Thus, effective current density is decreased, resulting in improvement of luminous efficiency.

Moreover, since the pad electrode 57 is electrically continuous with the contact part 51 through the via part 56, it is possible to lay out the pad electrode 57 freely at the back face side (the side of the second major surface 100b) of the semiconductor light emitting device 120. As illustrated in FIG. 10, the pad electrode 57 may be provided on a plurality of places on a plane at the back face side. The pad electrode 57 may also be formed on corners (at least one corner) at the back face side. Furthermore, the pad electrode 57 may also be formed on the central part at the back face side. In the semiconductor light emitting device 120, the layout of the pad electrode 57 can be easily set in consideration of how current flows between the first electrode 50 and the second electrode 60.

Figure 11:
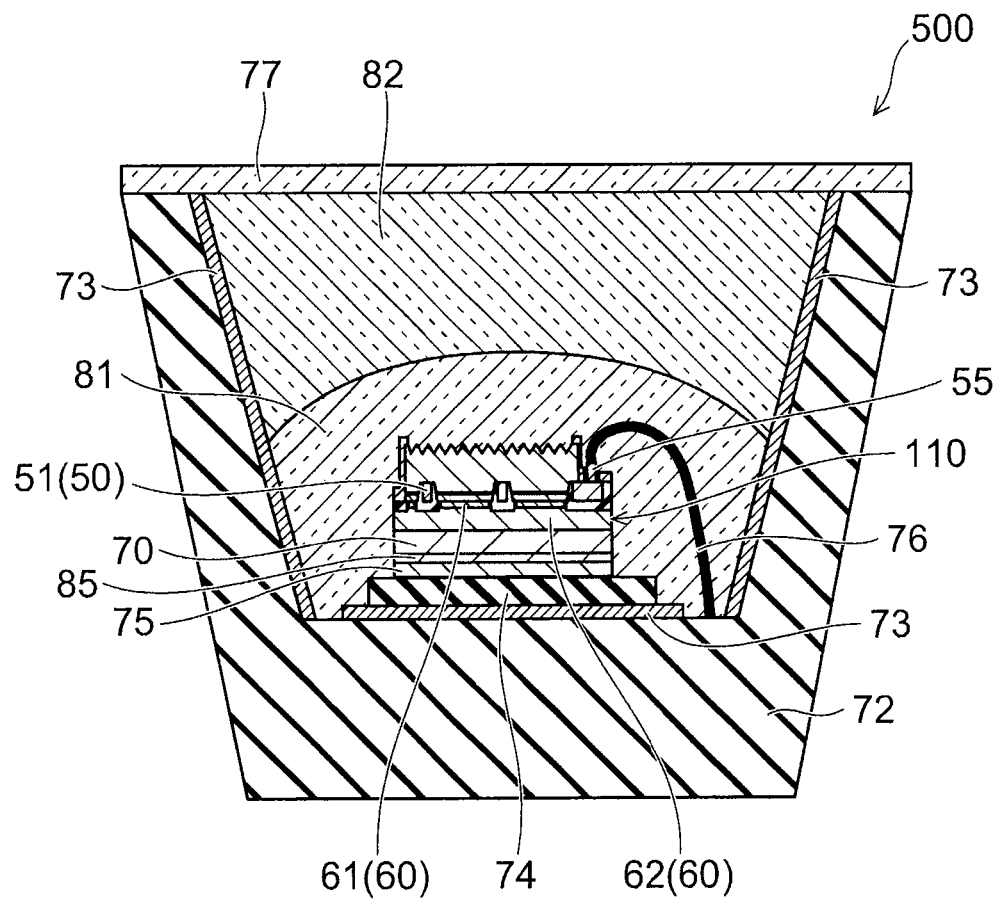
FIG. 11 is a schematic cross-sectional view illustrating a semiconductor light emitting apparatus.

FIG. 11 is a schematic cross-sectional view illustrating a configuration of a semiconductor light emitting apparatus using a semiconductor light emitting device according to an embodiment.

In this specific example, although the semiconductor light emitting device 110 according to the first embodiment is used, it is also possible for the semiconductor light emitting apparatus to use the semiconductor light emitting device 120 according to the other embodiment.

The semiconductor light emitting apparatus 500 is a white LED in which the semiconductor light emitting device 110 and a fluorescent material are combined. That is, the semiconductor light emitting apparatus 500 according to the embodiment includes the semiconductor light emitting device 110, and the fluorescent material which absorbs light emitted from the semiconductor light emitting device 110 and emits light of which wavelength is different from that of the above light.

As illustrated in FIG. 11, in the semiconductor light emitting apparatus 500 according to the embodiment, a reflective film 73 is provided on the inner face of a container 72 made of ceramics etc. The reflective film 73 is separately formed on the inner sidewall and the bottom of the container 72. The reflective film 73 is made of, for example, aluminum. Among them, on the reflective film 73 provided on the bottom of the container 72, the semiconductor light emitting device 110 is installed through a submount 74.

For the semiconductor light emitting device 110, while directing the side of the first major surface 100a upwards, the back face of its support substrate 70 is fixed to the submount 74. It is also possible to make use of adhesion through the use of adhesives, for fixation of the semiconductor light emitting device 110, the submount 74, and the reflective film 73.

An electrode 75 is provided on the surface of the submount 74 at the side of the semiconductor light emitting device 110. The support substrate 70 of the semiconductor light emitting device 110 is mounted on the electrode 75 through the back face electrode 85. Therefore, the electrode is electrically continuous with the second electrode 60 through the back face electrode 85 and the support substrate 70. The pad electrode 55 is connected to a non-illustrated electrode provided at the side of the container 72 using a bonding wire 76. These connection works are carried out between the inner sidewall side reflective film 73 and the bottom face side reflective film 73.

Moreover, a first fluorescent material layer 81 containing a red fluorescent material is provided so as to cover the semiconductor light emitting device 110 and the bonding wire 76. Furthermore, on the first fluorescent material layer 81, a second fluorescent material layer 82 containing a fluorescent material of blue, green, or yellow is formed. On the fluorescent material layer, a lid part 77 made of, such as a silicone resin, is provided.

The first fluorescent material layer 81 includes a resin and the red fluorescent material dispersed in the resin.

For the red fluorescent material, for example, $Y_2O_3$, $YVO_4$, or $Y_2(P,V)O_4$ may be used as a base material, and trivalent Eu ($Eu^{3+}$) is included in the matrix as an activation material. That is, $Y_2O_3{:}Eu^{3+}$, $YVO_4{:}Eu^{3+}$ or the like may be used as the red fluorescent material. The concentration of $Eu^{3+}$ can be 1% to 10% in terms of molarity.

For the base material of the red fluorescent material, LaOS, $Y_2(P,V)O_4$, or the like may also be used instead of $Y_2O_3$ or $YVO_4$. Furthermore, $Mn^{4+}$ or the like may also be used instead of $Eu^{3+}$. In particular, by adding trivalent Eu and a small amount of Bi to the base material of $YVO_4$, the absorption at 390 nm increases, and thus the luminous efficiency can be further enhanced. Moreover, for the resin, for example, silicone resin may be used.

Moreover, the second fluorescent material layer 82 includes a resin and at least any one of blue, green, and yellow fluorescent materials dispersed in the resin. For example, as the fluorescent material, a fluorescent material combining the blue fluorescent material and the green fluorescent material may be used, or a fluorescent material combining the blue fluorescent material and the yellow fluorescent material may be used, or a fluorescent material combining the blue fluorescent material, the green fluorescent material, and the yellow fluorescent material may be used.

As the blue fluorescent material, for example, $(Sr, Ca)_{10}(PO_4)_6Cl_2:Eu^{2+}$ or $BaMg_2Al_{16}O_{27}:Eu^{2+}$ may be used.

As the green fluorescent material, for example, $Y_2SiO_5:Ce^{3+}, Tb^{3+}$ using trivalent Tb as the emission center may be used. In this case, the excitation efficiency is improved because the energy is transferred from the Ce ion to the Tb ion. As the green fluorescent material, for example, $Sr_4Al_{14}O_{25}:Eu^{2+}$ may also be used.

As the yellow fluorescent material, for example, $Y_3Al_5:Ce^{3+}$ may be used.

Moreover, as the resin, for example, a silicone resin may be used. In particular, trivalent Tb exhibits sharp emission in the vicinity of 550 nm where the luminous efficiency is maximized, and thus, when trivalent Tb is combined with the sharp red emission of trivalent Eu, the luminous efficiency is significantly improved.

According to the semiconductor light emitting apparatus 500 according to the embodiment, the ultraviolet light generated by the semiconductor light emitting device 110 and having wavelength of, for example, 390 nm is emitted upwards and laterally from the device 110. Furthermore, the above fluorescent materials included in each of the fluorescent material layers are efficiently excited by ultraviolet light reflected by the reflective film 73. For example, in the above fluorescent material using trivalent Eu contained in the first fluorescent material layer 81 as the luminescence center, the light is converted into light having a narrow wavelength distribution in the vicinity of 620 nm. Thus, red visible light can be efficiently obtained.

Furthermore, the blue, green and yellow visible lights can be efficiently achieved by exciting the blue, green and yellow fluorescent materials included in the second fluorescent material layer 82. Furthermore, as mixed colors of them, it is possible to achieve white light or light of various colors with high efficiency and with good color rendering properties.

According to the semiconductor light emitting apparatus 500, light having a desired color can be achieved efficiently.

As described above, according to the semiconductor light emitting device according to the embodiments, the light extraction efficiency can be improved while enhancing the heat dissipation property.

Hereinabove, exemplary embodiments or their modifications are described. However, the invention is not limited to these examples. For example, examples made by a person skilled in the art by suitably adding or deleting constituents or adding design modification with respect to the above-mentioned embodiments or their modifications, or examples made by suitably combining features of the embodiments, are also included within the scope of the invention to the extent that the purport of the invention is included.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device comprising: a first semiconductor layer of a first conductivity type, the first semiconductor layer including a first portion and a second portion; a second electrode provided apart from the first semiconductor layer along a first direction intersecting a second direction from the first portion toward the second portion, the second electrode including a first part provided apart from the second portion along the first direction, and a second part provided apart from the first portion along the first direction; a second semiconductor layer of a second conductivity type provided between the first part and the second portion, the second semiconductor layer contacting the first part; a light emitting layer provided between the second semiconductor layer and the second portion; a first electrode including a contact part, the contact part being provided between the first portion and the second part, the contact part contacting the first portion; and a dielectric member provided between the contact part and the second electrode, and between the first semiconductor layer and the second electrode, and wherein a portion of the dielectric member is between the light emitting layer and the second electrode, a stacking body including the first semiconductor layer, the second semiconductor layer, and the light emitting layer, the stacking body has a side face, and at least a part of the side face of the stacking body being inclined with respect to the first direction, at least a part of an edge of the second semiconductor layer being covered with the dielectric member, wherein a part of the second semiconductor layer contacts the second part.

2. The device according to claim 1, wherein the first part is not covered with the dielectric member, and
the first part has a side face, the side face crosses a plane perpendicular to the first direction, at least a part of the side face contacts the second part.

3. The device according to claim 1, wherein
the first electrode includes a lead part extending from the contact part to an outside of a stacking body along a direction crossing the first direction, the stacking body including the first semiconductor layer, the second semiconductor layer, and the light emitting layer,
a side face of the lead part is covered with the dielectric member, the side face of the lead part crosses a plane perpendicular to the first direction.

4. The device according to claim 1, wherein
the first semiconductor layer further includes a third portion continuous with the first portion and with the second portion, the first portion provided between the second portion and the third portion,
the second electrode further includes a third part apart from the third portion along the first direction,
the second semiconductor layer includes a part provided between the third portion and the third part,
the third part being not covered with the dielectric member, and
the third part having a side face, the side face of the third part crosses the plane perpendicular to the first direction, at least a part of the side face of the third part contacts the second part.

5. The device according to claim 1, further comprising a support substrate being electrically continuous with the second electrode, the second electrode being disposed between the support substrate and the second semiconductor layer, and between the support substrate and the dielectric member,
the dielectric member is not provided between the support substrate and a portion of the second electrode overlapping the second semiconductor layer when projected onto a plane perpendicular to the first direction.

6. The device according to claim 1, wherein a first area in which the contact part contacts the first portion is smaller than a second area in which the second electrode overlaps the light emitting layer when projected onto a plane perpendicular to the first direction.

7. A semiconductor light emitting device comprising: a first semiconductor layer of a first conductivity type, the first semiconductor layer including a first portion and a second portion; a second electrode provided apart from the first semiconductor layer along a first direction intersecting a second direction from the first portion toward the second portion, the second electrode including a first part provided apart from the second portion along the first direction and being light reflective, and a second part provided apart from the first portion along the first direction; a second semiconductor layer of a second conductivity type provided between the first part and the second portion, the second semiconductor layer contacting the first part; a light emitting layer provided between the second semiconductor layer and the second portion; a first electrode including a contact part provided between the first portion and the second part, the contact part contacting the first portion, and a via part contacting the contact part and electrically connected with the contact part; a pad electrode electrically connected with the via part, the via part being disposed between the contact part and the pad electrode; and a dielectric member provided between the contact part and the second electrode, and between the first semiconductor layer and the second electrode, and wherein a portion of the dielectric member is between the light emitting layer and the second electrode, a stacking body including the first semiconductor layer, the second semiconductor layer, and the light emitting layer, the stacking body has a side face, and at least a part of the side face of the stacking body being inclined with respect to the first direction, and at least a part of an edge of the second semiconductor layer being covered with the dielectric member, wherein a part of the second semiconductor layer contacts the second part.

8. The device according to claim 7, wherein the first part is not covered with the dielectric member, and
the first part has a side face, the side face crosses a plane perpendicular to the first direction, at least a part of the side face contacts the second part.

9. The device according to claim 7, wherein
the first electrode includes a lead part extending from the contact part to an outside of a stacking body along a direction crossing the first direction, the stacking body including the first semiconductor layer, the second semiconductor layer, and the light emitting layer,
a side face of the lead part is covered with the dielectric member, the side face of the lead part crosses a plane perpendicular to the first direction.

10. The device according to claim 7, wherein
the first semiconductor layer further includes a third portion continuous with the first portion and with the second portion, the first portion provided between the second portion and the third portion,
the second electrode further includes a third part apart from the third portion along the first direction, the second semiconductor layer includes a part provided between the third portion and the third part,
the third part being not covered with the dielectric member, and
the third part having a side face, the side face of the third part crosses the plane perpendicular to the first direction, at least a part of the side face of the third part contacts the second part.

11. The device according to claim 7, further comprising a support substrate being electrically continuous with the second electrode, the second electrode being disposed between the support substrate and the second semiconductor layer, and between the support substrate and the dielectric member,
the dielectric member is not provided between the support substrate and a portion of the second electrode overlapping the second semiconductor layer when projected onto a plane perpendicular to the first direction.

12. The device according to claim 7, wherein a first area in which the contact part contacts the first portion is smaller than a second area in which the second electrode overlaps the light emitting layer when projected onto a plane perpendicular to the first direction.

* * * * *